United States Patent
Lee et al.

(10) Patent No.: US 9,893,721 B2
(45) Date of Patent: Feb. 13, 2018

(54) EDGE DETECTORS AND SYSTEMS OF ANALYZING SIGNAL CHARACTERISTICS INCLUDING THE SAME

(71) Applicant: SAMSUNG ELECTRONICS CO., LTD., Suwon-si, Gyeonggi-do (KR)

(72) Inventors: Dong-Seok Lee, Suwon-si (KR); Woo-Seok Kim, Suwon-si (KR); Jae-Jin Park, Seongnam-si (KR); Dong-Hyuk Lim, Seoul (KR); Dae-Young Chung, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/206,384

(22) Filed: Jul. 11, 2016

(65) Prior Publication Data

US 2017/0111035 A1    Apr. 20, 2017

(30) Foreign Application Priority Data

Oct. 19, 2015 (KR) .................. 10-2015-0145209

(51) Int. Cl.
*H03K 5/1534* (2006.01)
*H04L 7/00* (2006.01)
(Continued)

(52) U.S. Cl.
CPC .......... *H03K 5/1534* (2013.01); *H03K 19/21* (2013.01); *H04L 7/0037* (2013.01);
(Continued)

(58) Field of Classification Search
CPC ... H03K 5/1534; H04L 7/0016; H04L 7/0033; H04L 7/0037; H04L 7/0087
(Continued)

(56) References Cited

U.S. PATENT DOCUMENTS

| | | | |
|---|---|---|---|
| 6,924,683 B1 * | 8/2005 | Hayter | H03K 3/012 327/212 |
| 7,158,899 B2 | 1/2007 | Sunter et al. | |

(Continued)

FOREIGN PATENT DOCUMENTS

EP    2044692    12/2009

OTHER PUBLICATIONS

Hyun Choi et al., "Enhanced Resolution Jitter Testing Using Jitter Expansion", 25th IEEE VLSI Test Symposium (VTS'07), May 6-10, 2007.

(Continued)

*Primary Examiner* — William Hernandez
(74) *Attorney, Agent, or Firm* — F. Chau & Associates, LLC

(57) ABSTRACT

An edge detector includes a differential signal generator, a sense amplifier and a latch. The differential signal generator delays an input signal to generate a first differential signal and inverts the input signal to generate a second differential signal. The sense amplifier amplifies a difference between the first differential signal and the second differential signal to generate a first amplification signal and a second amplification signal at a first edge of a test clock signal and resets the first amplification signal and the second amplification signal at a second edge of the test clock signal. The latch generates an edge signal corresponding to edge information of the input signal in response to the first amplification signal and the second amplification signal.

20 Claims, 13 Drawing Sheets

(51) Int. Cl.
    *H03K 19/21* (2006.01)
    *H01L 27/118* (2006.01)
(52) U.S. Cl.
    CPC ...... *H04L 7/0087* (2013.01); *H01L 27/11803* (2013.01); *H01L 2027/11881* (2013.01)
(58) Field of Classification Search
    USPC .......................................................... 327/24
    See application file for complete search history.

(56) References Cited

U.S. PATENT DOCUMENTS

| | | | |
|---|---|---|---|
| 7,474,974 B2 | 1/2009 | Roberts et al. | |
| 7,606,675 B2 | 10/2009 | Panis | |
| 7,636,642 B2 | 12/2009 | Halle et al. | |
| 7,768,320 B1* | 8/2010 | Yang | G11C 7/02 327/215 |
| 7,791,330 B2 | 9/2010 | Heidel et al. | |
| 7,930,120 B2 | 4/2011 | Cranford, Jr. et al. | |
| 8,526,551 B2 | 9/2013 | Flynn et al. | |
| 2003/0052715 A1* | 3/2003 | Barnes | G11C 7/065 327/51 |
| 2007/0263757 A1 | 11/2007 | Dally et al. | |

OTHER PUBLICATIONS

J.D. Schaub et al., "On-Chip Jitter and Oscilloscope Circuits Using an Asynchronous Sample Clock", Solid-State Circuits Conference, 2008, ESSCIRC 2008, 34th European, pp. 126-129.

* cited by examiner

EDGE DETECTORS AND SYSTEMS OF ANALYZING SIGNAL CHARACTERISTICS INCLUDING THE SAME

CROSS-REFERENCE TO RELATED APPLICATION

This U.S. non-provisional patent application claims priority under 35 U.S.C. § 119 to Korean Patent Application No. 10-2015-0145209, filed on Oct. 19, 2015, in the Korean Intellectual Property Office (KIPO), the disclosure of which is incorporated by reference herein in its entirety.

TECHNICAL FIELD

Exemplary embodiments of the present inventive concept relate generally to signal characteristic analysis, and more particularly to edge detectors and systems of analyzing signal characteristics including the same.

DISCUSSION OF THE RELATED ART

As the integration rate of a semiconductor integrated circuit (IC) increases, a number of devices per unit area in a semiconductor die on which the semiconductor IC is mounted increases. This increased integration rate may lead to an increase in errors that may occur when a clock signal is delivered to the devices in the semiconductor die. For example, the clock signal may have jitter and a duty cycle of the clock signal may be changed.

SUMMARY

According to an exemplary embodiment of the present inventive concept, an edge detector includes a differential signal generator, a sense amplifier and a latch. The differential signal generator delays an input signal to generate a first differential signal and inverts the input signal to generate a second differential signal. The sense amplifier amplifies a difference between the first differential signal and the second differential signal to generate a first amplification signal and a second amplification signal at a first edge of a test clock signal and resets the first amplification signal and the second amplification signal at a second edge of the test clock signal. The latch generates an edge signal corresponding to edge information of the input signal in response to the first amplification signal and the second amplification signal.

In an exemplary embodiment of the present inventive concept, the input signal may be a periodic signal having a first period (P), and the test clock signal may have a second period corresponding to a sum of a third period and a fourth period. The third period may correspond to N*P, the fourth period may correspond to M*P, N may be a natural number and M may be a rational number greater than zero and smaller than one.

In an exemplary embodiment of the present inventive concept, a duty cycle of the edge signal may be substantially the same as a duty cycle of the input signal, and a jitter of the edge signal at an edge may be substantially the same as a jitter of the input signal at a corresponding edge. The differential signal generator may delay the input signal by a first time to generate the first differential signal and invert the input signal for a second time to generate the second differential signal. The first time may be substantially the same as the second time.

In an exemplary embodiment of the present inventive concept, the differential signal generator may include a delay circuit and an inverting circuit. The delay circuit may generate the first differential signal by delaying the input signal. The inverting circuit may generate the second differential signal by inverting the input signal.

The delay circuit may include a PMOS transistor and an NMOS transistor and the input signal may be input to a first internal node of the delay circuit. The PMOS transistor may have a source coupled to the first internal node, a gate for receiving a first offset voltage and a drain coupled to a second internal node of the delay circuit. The first differential signal may be output at the second internal node. The NMOS transistor may have a drain coupled to the first internal node, a gate for receiving a second offset voltage and a source coupled to the second internal node. The delay circuit may adjust a first propagation delay of the delay circuit in response to the first offset voltage and the second offset voltage such that the first propagation delay is substantially the same as a second propagation delay of the inverting circuit.

The delay circuit may include a first inverter and a second inverter. The first inverter may have an input terminal for receiving the input signal and an output terminal coupled to an input terminal of the second inverter. The second inverter may have an output terminal at which the first differential signal is output. A sum of a first propagation delay of the first inverter and a second propagation delay of the second inverter may be substantially the same as a propagation delay of the inverting circuit.

The delay circuit may adjust the first propagation delay in response to the first offset voltage and the second offset voltage.

The delay circuit may include a first exclusive OR gate. The first exclusive OR gate may have a first input terminal for receiving a ground voltage, a second input terminal for receiving the input signal and an output terminal that outputs the first differential signal. The inverting circuit may include a second exclusive OR gate. The second exclusive OR gate may have a first input terminal for receiving a power supply voltage, a second input terminal for receiving the input signal and an output terminal that outputs the second differential signal. A propagation delay of the first exclusive OR gate may be substantially the same as a propagation delay of the second exclusive OR gate.

In an exemplary embodiment of the present inventive concept, the sense amplifier may include first through fourth PMOS transistors and first through sixth NMOS transistors. The first PMOS transistor may have a source coupled to a power supply voltage, a gate for receiving the test clock signal and a drain coupled to a first internal node of the sense amplifier that outputs the first amplification signal. The second PMOS transistor may have a source coupled to the power supply voltage, a gate coupled to a second internal node of the sense amplifier and a drain coupled to the first internal node. The third PMOS transistor may have a source coupled to the power supply voltage, a gate coupled to the first internal node and a drain coupled to the second internal node that outputs the second amplification signal. The fourth PMOS transistor may have a source coupled to the power supply voltage, a gate for receiving the test clock signal and a drain coupled to the second internal node. The first NMOS transistor may have a drain coupled to the first internal node, a gate coupled to the second internal node and a source coupled to a third internal node of the sense amplifier. The second NMOS transistor may have a drain coupled to the second internal node, a gate coupled to the first internal node and a source coupled to a fourth internal node of the sense amplifier. The third NMOS transistor may have a drain coupled to the third internal node, a gate for receiving the test clock signal and a source coupled to a fifth internal node of the sense amplifier. The fourth NMOS transistor may have a drain coupled to the fourth internal node, a gate for receiving the test clock signal and a source coupled to a sixth internal node of the sense amplifier. The fifth NMOS transistor may have a drain coupled to the fifth internal node, a gate for receiving the first differential signal and a source coupled to a ground voltage. The sixth NMOS transistor may have a drain coupled to the sixth internal node, a gate for receiving the second differential signal and a source coupled to the ground voltage.

In an exemplary embodiment of the present inventive concept, the sense amplifier may reset the first amplification signal and the second amplification signal to a power supply voltage at the second edge of the test clock signal.

In an exemplary embodiment of the present inventive concept, the latch may include an S-R latch.

In an exemplary embodiment of the present inventive concept, the sense amplifier and the latch may be located in P-well regions in a primitive cell and NMOS transistors in the differential signal generator, the sense amplifier and the latch may be located in N sub-regions in the primitive cell.

In an exemplary embodiment of the present inventive concept, the first edge of the test clock signal may be a rising edge and the second edge of the test clock signal may be a falling edge.

According to an exemplary embodiment of the present inventive concept, a system of analyzing a signal characteristic includes an integrated circuit and a processor. The integrated circuit includes an edge detector that generates a second signal corresponding to edge information of a first signal in response to a clock signal. The processor analyzes a characteristic of the first signal in response to the second signal. The edge detector includes a differential signal generator, a sense amplifier and a latch. The differential signal generator delays the first signal to generate a first differential signal and inverts the first signal to generate a second differential signal. The sense amplifier amplifies a difference between the first differential signal and the second differential signal to generate a first amplification signal and a second amplification signal at a first edge of a clock signal and resets the first amplification signal and the second amplification signal at a second edge of the clock signal. The latch generates the second signal in response to the first amplification signal and the second amplification signal.

In an exemplary embodiment of the present inventive concept, the processor may analyze the characteristic of the first signal by performing a processing operation which uses a pulse density modulation on the second signal.

In an exemplary embodiment of the present inventive concept, the first signal may be a periodic signal having a first period (P), and the clock signal may have a second period corresponding to a sum of a third period and a fourth period. The third period may correspond to N*P, the fourth period may correspond to M*P, N may be a natural number and M may be a rational number greater than zero and smaller than one.

According to an exemplary embodiment of the present inventive concept, an edge detector includes: a signal generator configured to generate a first signal by delaying an input signal and to generate a second signal by inverting the input signal; a sense amplifier configured to generate third and fourth signals based on a difference between the first and second signals in response to a first edge of a clock signal and place both of the third and fourth signals at a power supply voltage level in response to a second edge of the clock signal; and a storage circuit configured to generate an output signal in response to the third and fourth signals, wherein the output signal includes edge information of the input signal.

In an exemplary embodiment of the present inventive concept, the third signal may ha a ground voltage level before it has the power supply voltage level.

In an exemplary embodiment of the present inventive concept, the fourth signal may maintain the power supply voltage level for a plurality of consecutive periods.

In an exemplary embodiment of the present inventive concept, a frequency of the clock may be less than a frequency of the input and output signals.

BRIEF DESCRIPTION OF THE DRAWINGS

The above and other features of the present inventive concept will become more clearly understood by describing in detail exemplary embodiments thereof with reference to the accompanying drawings.

DETAILED DESCRIPTION OF THE EMBODIMENTS

Figure 1:
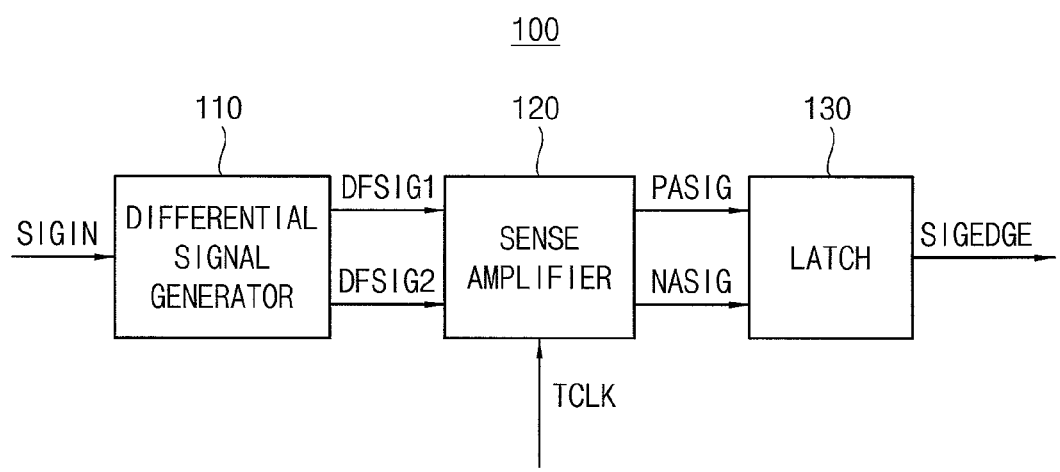
FIG. 1 is a block diagram illustrating an edge detector according to an exemplary embodiment of the present inventive concept.

Exemplary embodiments of the present inventive concept will be described more fully hereinafter with reference to the accompanying drawings. The present inventive concept may, however, be embodied in many different forms and should not be construed as limited to the exemplary embodiments set forth herein. In the drawings, the sizes and relative sizes of layers and regions may be exaggerated for clarity. Like numerals may refer to like elements throughout this application. All elements shown in the drawings or hereinafter described may be composed of circuits.

It will be understood that when an element is referred to as being "connected" or "coupled" to another element, it can be directly connected or coupled to the other element or intervening elements may be present.

As used herein, the singular forms "a," "an" and "the" are intended to include the plural forms as well, unless the context clearly indicates otherwise.

FIG. 1 is a block diagram illustrating an edge detector according to an exemplary embodiment of the present inventive concept.

Referring to FIG. 1, an edge detector 100 includes a differential signal generator 110, a sense amplifier 120 and a latch 130.

The differential signal generator 110 receives an input signal SIGIN. The differential signal generator 110 delays the input signal SIGIN to generate a first differential signal DFSIG1 and inverts the input signal SIGIN to generate a second differential signal DFSIG2. The differential signal generator 110 may delay the input signal SIGIN for a first time to generate the first differential signal DFSIG1. The differential signal generator 110 may invert the input signal SIGIN for a second time to generate the second differential signal DFSIG2. The first time and the second time may be substantially the same as each other. The configuration and operation of the differential signal generator 110 will be described later with reference to FIGS. 2 through 6.

The sense amplifier 120 amplifies a difference between the first differential signal DFSIG1 and the second differential signal DFSIG2 to generate a first amplification signal PASIG and a second amplification signal NASIG at a rising edge of a test clock signal TCLK. The sense amplifier 120 resets the first amplification signal PASIG and the second amplification signal NASIG at a falling edge of the test clock signal TCLK. Exemplary embodiments of the sense amplifier 120 will be described later with reference to FIGS. 7 and 8.

The latch 130 generates an edge signal SIGEDGE corresponding to edge information of the input signal SIGIN based on the first amplification signal PASIG and the second amplification signal NASIG. The latch 130 may be implemented with an S-R latch. The configuration and operation of the latch 120 will be described later with reference to FIG. 9.

In an exemplary embodiment of the present inventive concept, the input signal SIGIN may be a periodic signal having a first frequency. For example, the input signal SIGIN may be a clock signal.

In an exemplary embodiment of the present inventive concept, a duty cycle of edge signal SIGEDGE may be substantially the same as a duty cycle of the input signal SIGIN, and a jitter of the edge signal SIGEDGE at an edge may be substantially the same as a jitter of the input signal SIGIN at an edge. The relationship between the input signal SIGIN and the edge signal SIGEDGE will be described later with reference to FIGS. 10 and 11.

Figure 2:
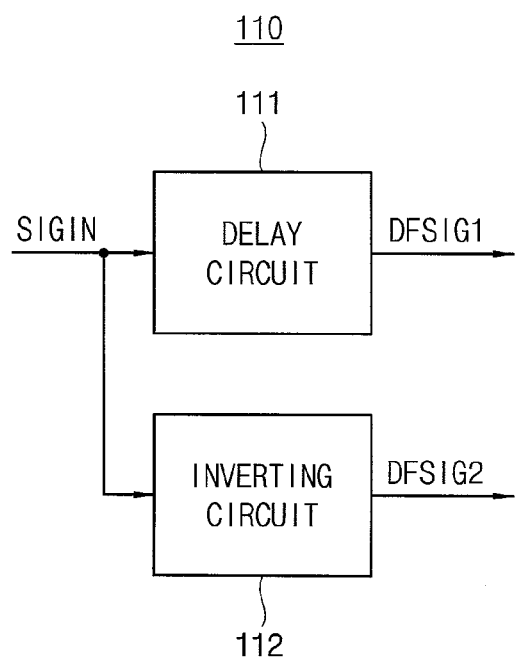
FIG. 2 is a block diagram illustrating a differential signal generator in the edge detector of FIG. 1 according to an exemplary embodiment of the present inventive concept.

FIG. 2 is a block diagram illustrating the differential signal generator in the edge detector of FIG. 1 according to an exemplary embodiment of the present inventive concept.

Referring to FIG. 2, the differential signal generator 110 includes a delay circuit 111 and an inverting circuit 112.

The delay circuit 111 generates the first differential signal DFSIG1 by delaying the input signal SIGIN. The inverting circuit 112 generates the second differential signal DFSIG2 by inverting the input signal SIGIN. A first propagation delay of the delay circuit 111 is a time interval from a time when the input signal SIGIN is applied to the delay circuit 111 to a time when the delay circuit 111 outputs the first differential signal DFSIG1. A second propagation delay of the inverting circuit 112 is a time interval from a time when the input signal SIGIN is applied to the inverting circuit 112 to a time when the inverting circuit 112 outputs the second differential signal DFSIG2.

FIGS. 3, 4, 5 and 6 are circuit diagrams respectively illustrating the delay circuit in the differential signal generator of FIG. 2 according to an exemplary embodiment of the present inventive concept.

Figure 3:
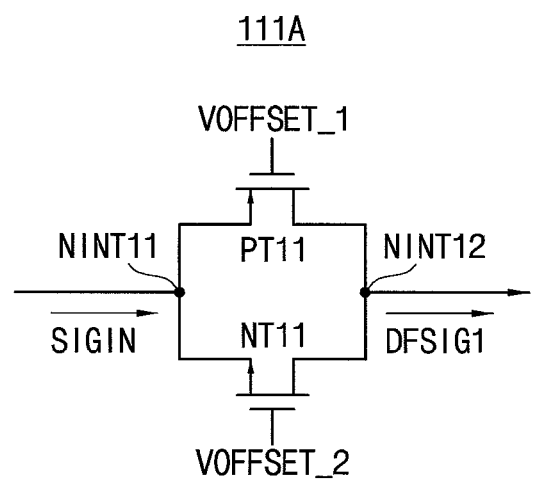
FIGS. 3, 4, 5 and 6 are circuit diagrams respectively illustrating a delay circuit in the differential signal generator of FIG. 2 according to an exemplary embodiment of the present inventive concept.

Referring to FIG. 3, a delay circuit 111A may include a PMOS transistor PT11 and an NMOS transistor NT11.

The input signal SIGIN is input to a first internal node NINT11. The PMOS transistor PT11 has a source coupled to the first internal node NINT11, a gate for receiving a first offset voltage VOFFSET_1 and a drain coupled to a second internal node NINT12. The first differential signal DFSIG1 may be output at the second internal node NINT12. The NMOS transistor NT11 has a drain coupled to the first internal node NINT11, a gate for receiving a second offset voltage VOFFSET_2 and a source coupled to the second internal node NINT12. The delay circuit 111A may adjust a first propagation delay of the delay circuit 111A based on the first offset voltage VOFFSET_1 and the second offset voltage VOFFSET_2 such that the first propagation delay is substantially the same as a second propagation delay of the inverting circuit 112.

Figure 4:
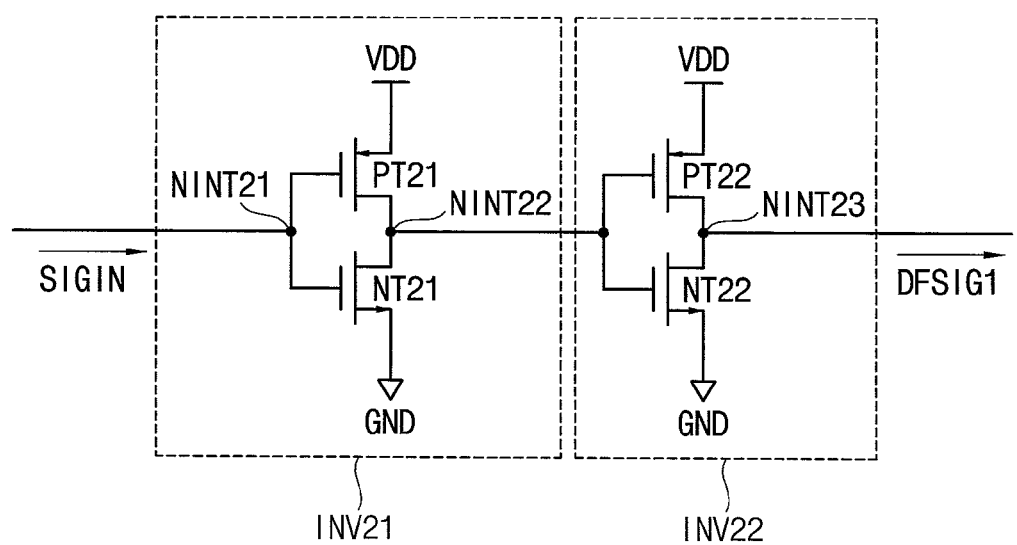

Referring to FIG. 4, a delay circuit 111B may include a first inverter INV21 and a second inverter INV22.

The first inverter INV21 has an input terminal for receiving the input signal SIGIN and an output terminal coupled to an input terminal of the second inverter INV22. The second inverter INV22 has an output terminal at which the first differential signal DFSIG1 is output. A sum of a propagation delay of the first inverter INV21 and a propagation delay of the second inverter is INV22 substantially the same as a propagation delay of the inverting circuit 112.

The first inverter INV21 includes a first PMOS transistor PT21 and a first NMOS transistor NT21. The second inverter INV22 includes a second PMOS transistor PT22 and a second NMOS transistor NT22.

The input signal SIGIN is input to a first internal node NINT21 of the first inverter INV21. The first PMOS transistor PT21 has a source coupled to a power supply voltage VDD, a gate coupled to the first internal node NINT21 and a drain coupled to a second internal node NINT22 of the first inverter INV21. The first NMOS transistor NT21 has a drain coupled to the second internal node NINT22, a gate coupled to the first internal node NINT21 and a source coupled to a ground voltage GND. The second PMOS transistor PT22 has a source coupled to the power supply voltage VDD, a gate coupled to the second internal node NINT22 and a drain coupled to a third internal node NINT23 of the second inverter INV22. The second NMOS transistor NT22 has a drain coupled to the third internal node NINT23, a gate coupled to the second internal node NINT22 and a source coupled to the ground voltage GND. The first differential signal DFSIG1 is output at the third internal node NINT23.

Figure 5:
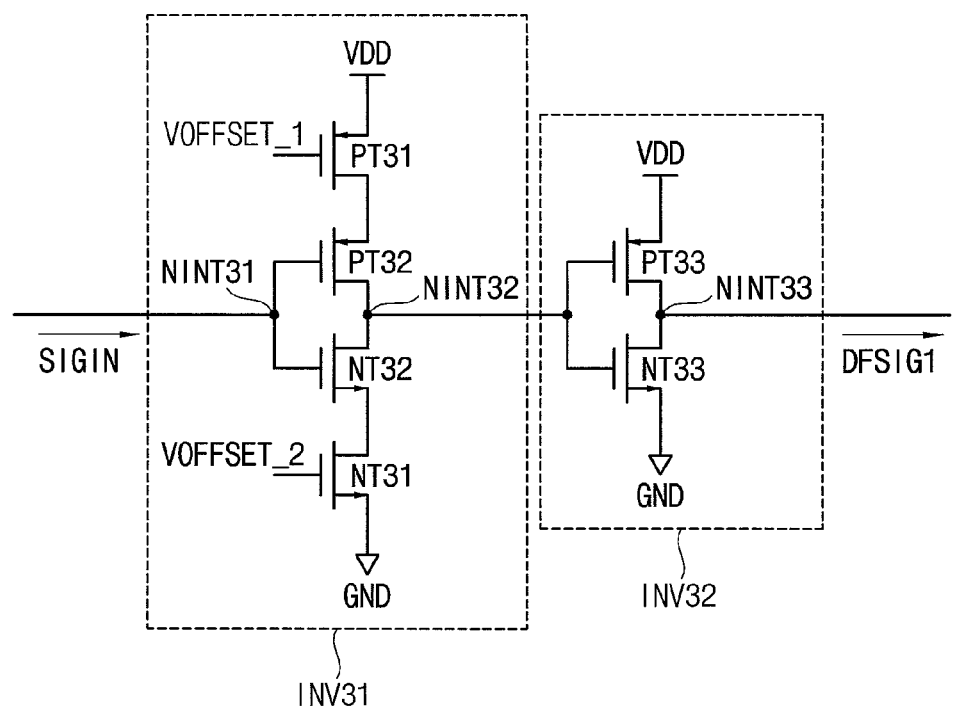

Referring to FIG. 5, a delay circuit 111C may include a first inverter INV31 and a second inverter INV32.

The first inverter INV31 has an input terminal for receiving the input signal SIGIN and an output terminal coupled to an input terminal of the second inverter INV32. The second inverter INV32 has an output terminal at which the first differential signal DFSIG1 is output. The first inverter INV31 includes a first PMOS transistor PT31, a second PMOS transistor PT32, a first NMOS transistor NT31 and a second NMOS transistor NT32. The second inverter INT32 includes a third PMOS transistor PT33 and a third NMOS transistor NT33.

The input signal SIGIN is input to a first internal node NINT31 of the first inverter INV31. The first PMOS transistor PT31 has a source coupled to a power supply voltage VDD, a gate for receiving the first offset voltage VOFFSET_1 and a drain coupled to the second PMOS transistor PT32. The second PMOS transistor PT32 has a source coupled to the drain of the first PMOS transistor PT31, a gate coupled to the first internal node NINT31 and a drain coupled to a second internal node NINT32 of the first inverter INV31. The second NMOS transistor NT32 has a drain coupled to the second internal node NINT32, a gate coupled to the first internal node NINT31 and a source coupled to the first NMOS transistor NT31. The first NMOS transistor NT31 has a drain coupled to a source of the second NMOS transistor NT32, a gate for receiving the second offset voltage VOFFSET_2 and a source coupled to the ground voltage GND. The third PMOS transistor PT33 has a source coupled to the power supply voltage VDD, a gate coupled to the second internal node NINT32 and a drain coupled to a third internal node NINT33 of the second inverter INV32. The third NMOS transistor NT33 has a drain coupled to the third internal node NINT33, a gate coupled to the second internal node NINT32 and a source coupled to the ground voltage GND. The first differential signal DFSIG1 is output at the third internal node NINT33.

The delay circuit 111C may adjust a propagation delay of the first inverter INV31 based on the first offset signal VOFFSET_1 and the second offset signal VOFFSET_2 such that a sum of the propagation delay of the first inverter INV31 and a propagation delay of the second inverter is INV32 substantially the same as a propagation delay of the inverting circuit 112.

Figure 6:
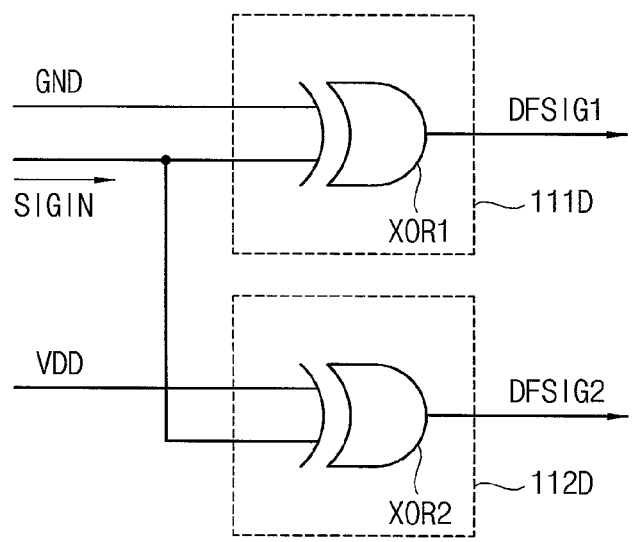

FIG. 6 is a circuit diagram illustrating the differential signal generator of FIG. 2 according to an exemplary embodiment of the present inventive concept.

Referring to FIG. 6, a differential signal generator 110-1 includes a delay circuit 111D and an inverting circuit 112D. The delay circuit 111D includes a first exclusive OR gate XOR1 and the inverting circuit 112D includes a second exclusive OR gate XOR2.

The first exclusive OR gate XOR1 has a first input terminal for receiving the ground voltage GND, a second input terminal for receiving the input signal SIGIN and an output terminal that outputs the first differential signal DFSIG1. The second exclusive OR gate XOR2 has a first input terminal for receiving the power supply voltage VDD, a second input terminal for receiving the input signal SIGIN and an output terminal that outputs the second differential signal DFSIG2. A propagation delay of the first exclusive OR gate XOR1 may be substantially the same as a propagation delay of the second exclusive OR gate XOR2.

Figure 7:
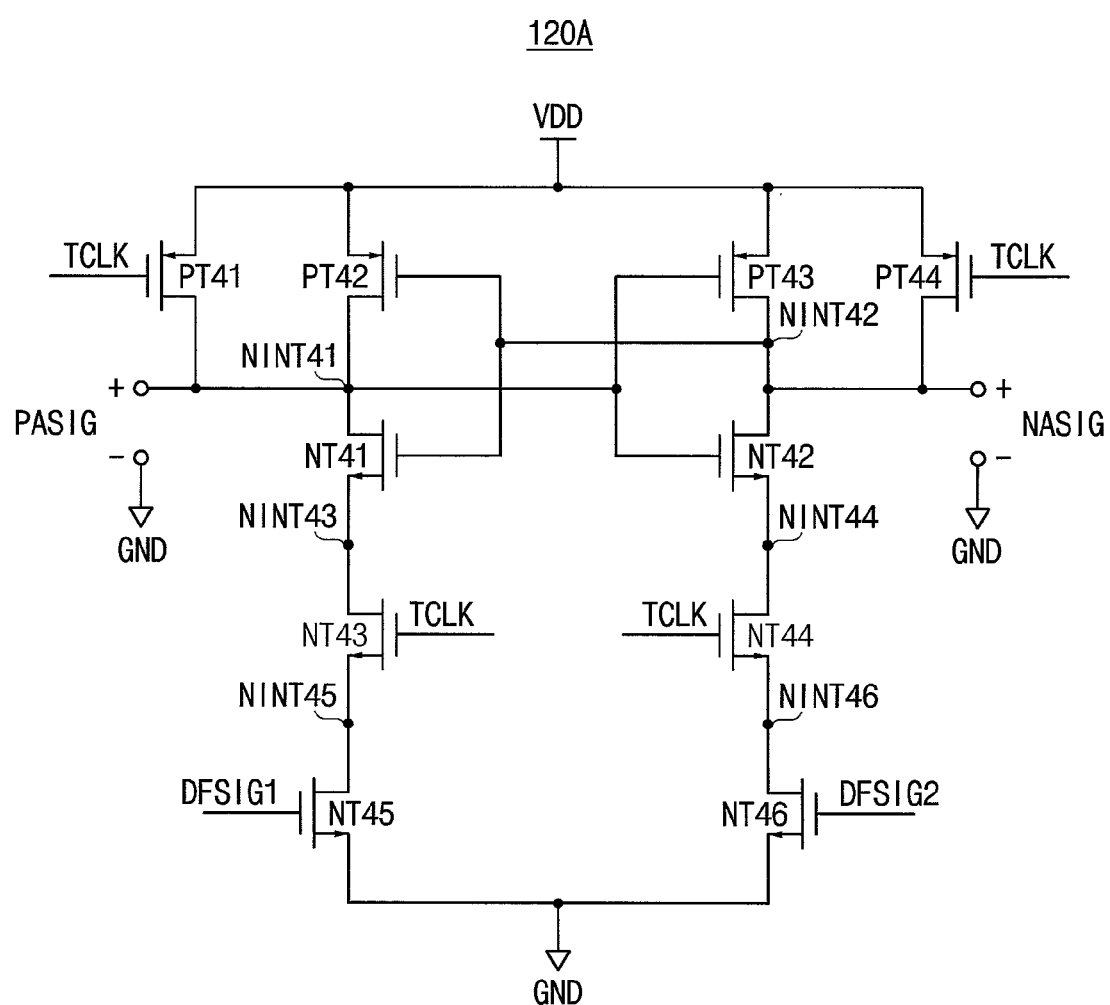
FIG. 7 is a circuit diagram illustrating a sense amplifier in the edge detector of FIG. 1 according to an exemplary embodiment of the present inventive concept.

FIG. 7 is a circuit diagram illustrating the sense amplifier in the edge detector of FIG. 1 according to an exemplary embodiment of the present inventive concept.

Referring to FIG. 7, a sense amplifier 120A may include first through fourth PMOS transistors PT41~PT44 and first through sixth NMOS transistors NT41~NT46.

The first PMOS transistor PT41 has a source coupled to the power supply voltage VDD, a gate for receiving the test clock signal TCLK and a drain coupled to a first internal node NINT41 that outputs the first amplification signal PASIG. The second PMOS transistor PT42 has a source coupled to the power supply voltage VDD, a gate coupled to a second internal node NINT42 and a drain coupled to the first internal node NINT41. The third PMOS transistor PT42 has a source coupled to the power supply voltage VDD, a gate coupled to the first internal node NINT41 and a drain coupled to the second internal node NINT42 that outputs the second amplification signal NASIG. The fourth PMOS transistor PT44 has a source coupled to the power supply voltage VDD, a gate for receiving the test clock signal TCLK and a drain coupled to the second internal node NINT42.

The first NMOS transistor NT41 has a drain coupled to the first internal node NINT41, a gate coupled to the second internal node NINT42 and a source coupled to a third internal node NINT43. The second NMOS transistor NT42 has a drain coupled to the second internal node NINT42, a gate coupled to the first internal node NINT41 and a source coupled to a fourth internal node NINT44. The third NMOS transistor NT43 has a drain coupled to the third internal node NINT43, a gate for receiving the test clock signal TCLK and a source coupled to a fifth internal node NINT45. The fourth NMOS transistor NT44 has a drain coupled to the fourth internal node NINT44, a gate for receiving the test clock signal TCLK and a source coupled to a sixth internal node NINT46. The fifth NMOS transistor NT45 has a drain coupled to the fifth internal node NINT45, a gate for receiving the first differential signal DFSIG1 and a source coupled to the ground voltage GND. The sixth NMOS transistor NT46 has a drain coupled to the sixth internal node NINT46, a gate for receiving the second differential signal DFSIG2 and a source coupled to the ground voltage GND.

When a level of the first differential signal DFSIG1 is higher than a level of the second differential signal DFSIG2 at a rising edge of the test clock signal TCLK, the third NMOS transistor NT43 and the fourth NMOS transistor NT44 are turned-on, and a voltage level of the third internal node NINT43 is lower than a voltage level of the fourth internal node NINT44. The first internal node NINT41 is coupled with the third internal node NINT43 (e.g., via NT41) and the second internal node NINT42 is coupled with the fourth internal node NINT44 (e.g., via NT42). Since a voltage level of the first internal node NINT41 is relatively lower than a voltage level of the second internal node NINT42 and due to a positive feedback of the first internal node NINT41, the third PMOS transistor PT43 is gradually turned-on, the second PMOS transistor PT42 is gradually turned-off and the power supply voltage VDD appears at the second internal node NINT42. In addition, since the voltage level of the second internal node NINT42 is relatively higher than the voltage level of the first internal node NINT41 and due to a positive feedback of the second internal node NINT42, the second PMOS transistor PT42 is gradually turned-off, the first PMOS transistor PT41 is gradually turned-on and the ground voltage GND appears at the first internal node NINT41. The above mentioned state is maintained from a rising edge of the test clock signal TCLK and to an activation interval of the test clock signal TCLK.

When the level of the first differential signal DFSIG1 is lower than a level of the second differential signal DFSIG2 at a rising edge of the test clock signal TCLK, the third NMOS transistor NT43 and the fourth NMOS transistor NT44 are turned-on, and a voltage level of the third internal node NINT43 is higher than a voltage level of the fourth internal node NINT44. The first internal node NINT41 is coupled with the third internal node NINT43 (e.g., via NT41) and the second internal node NINT42 is coupled with the fourth internal node NINT44 (e.g., via NT42). Since a voltage level of the first internal node NINT41 is relatively higher than a voltage level of the second internal node NINT42 and due to a positive feedback of the first internal node NINT41, the third PMOS transistor PT43 is gradually turned-off, the second PMOS transistor PT42 is gradually turned-on and the ground voltage appears at the second internal node NINT42. In addition, since the voltage level of the second internal node NINT42 is relatively lower than the voltage level of the first internal node NINT41 and due to a positive feedback of the second internal node NINT42, the second PMOS transistor PT42 is gradually turned-on, the first PMOS transistor PT41 is gradually turned-off and the power supply voltage VDD appears at the first internal node NINT41. The above mentioned state is maintained from a rising edge of the test clock signal TCLK and to an activation interval of the test clock signal TCLK.

The sense amplifier 120A may reset the first amplification signal PASIG and the second amplification signal NASIG to the power supply voltage VDD at a falling edge of the test clock signal TCLK. When the test clock signal TCLK is disabled in the falling edge thereof, the first PMOS transistor PT41 and the fourth PMOS transistor PT44 are turned-on to thus reset the first amplification signal PASIG and the second amplification signal NASIG to the power supply voltage VDD.

The third NMOS transistor NT43 may reduce or prevent a kick-back phenomenon from occurring, in which a voltage of the third internal node NINT43 passes through the gate of the fifth NMOS transistor NT45 to influence the first differential signal DFSIG1. In addition, the fourth NMOS transistor NT44 may reduce or prevent a kick-back phenomenon from occurring, in which a voltage of the fourth internal node NINT44 passes through the gate of the sixth NMOS transistor NT46 to influence the second differential signal DFSIG2.

Figure 8:
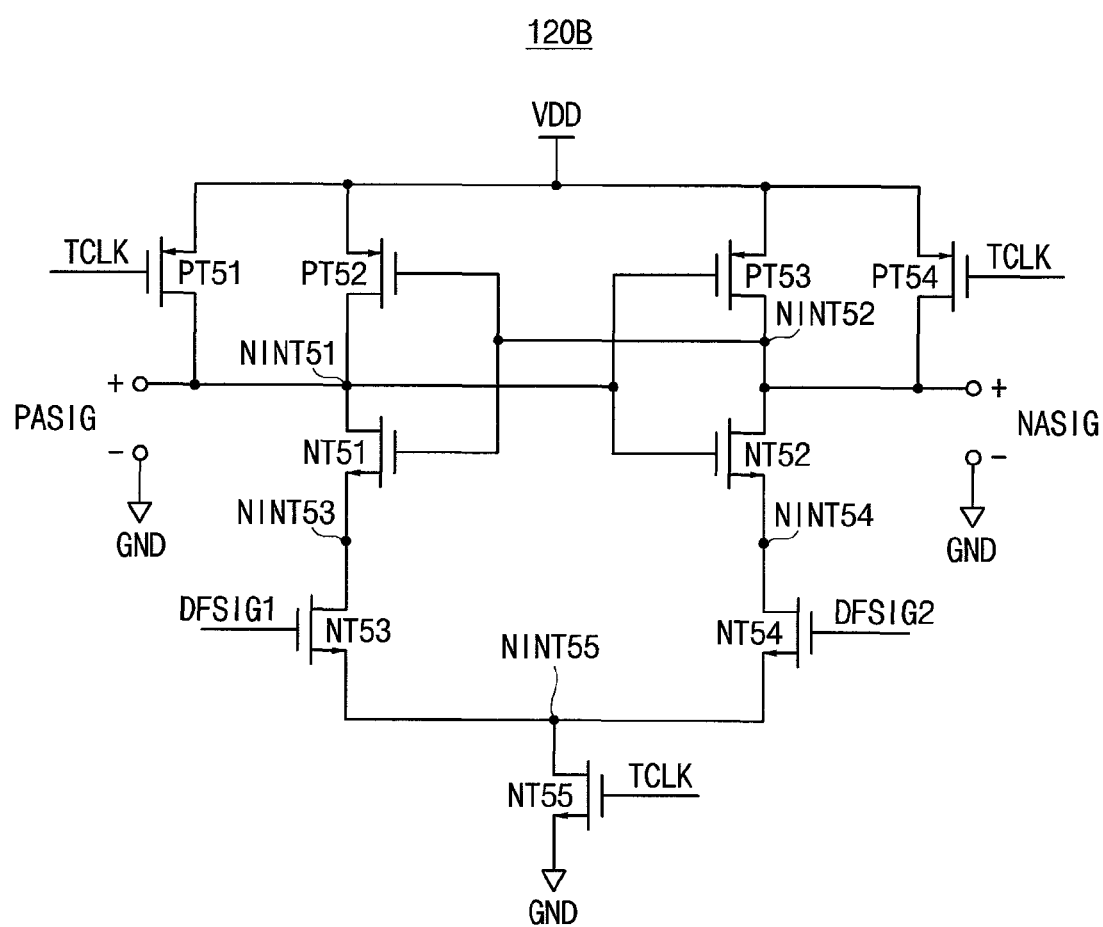
FIG. 8 is a circuit diagram illustrating a sense amplifier in the edge detector of FIG. 1 according to an exemplary embodiment of the present inventive concept.

FIG. 8 is a circuit diagram illustrating the sense amplifier in the edge detector of FIG. 1 according to an exemplary embodiment of the present inventive concept.

Referring to FIG. 8, a sense amplifier 120B may include first through fourth PMOS transistors PT51~PT54 and first through fifth NMOS transistors NT51~NT55.

The first PMOS transistor PT51 has a source coupled to the power supply voltage VDD, a gate for receiving the test clock signal TCLK and a drain coupled to a first internal node NINT51 that outputs the first amplification signal PASIG. The second PMOS transistor PT52 has a source coupled to the power supply voltage VDD, a gate coupled to a second internal node NINT52 and a drain coupled to the first internal node NINT51. The third PMOS transistor PT53 has a source coupled to the power supply voltage VDD, a gate coupled to the first internal node NINT51 and a drain coupled to the second internal node NINT52 that outputs the second amplification signal NASIG. The fourth PMOS transistor PT54 has a source coupled to the power supply voltage VDD, a gate for receiving the test clock signal TCLK and a drain coupled to the second internal node NINT52.

The first NMOS transistor NT51 has a drain coupled to the first internal node NINT51, a gate coupled to the second internal node NINT52 and a source coupled to a third internal node NINT53. The second NMOS transistor NT52 has a drain coupled to the second internal node NINT42, a gate coupled to the first internal node NINT51 and a source coupled to a fourth internal node NINT54. The third NMOS transistor NT53 has a drain coupled to the third internal node NINT53, a gate for receiving the first differential signal DFSIG1 and a source coupled to a fifth internal node NINT55. The fourth NMOS transistor NT54 has a drain coupled to the fourth internal node NINT54, a gate for receiving the second differential signal DFSIG2 and a source coupled to the fifth internal node NINT55. The fifth NMOS transistor NT55 has a drain coupled to the fifth internal node NINT55, a gate for receiving the test clock signal TCLK and a source coupled to the ground voltage GND.

The operation of the sense amplifier 120B of FIG. 8 is substantially similar to operation of the sense amplifier 120A of FIG. 7, and thus a description of the operation of the sense amplifier 120B will be omitted.

Figure 9:
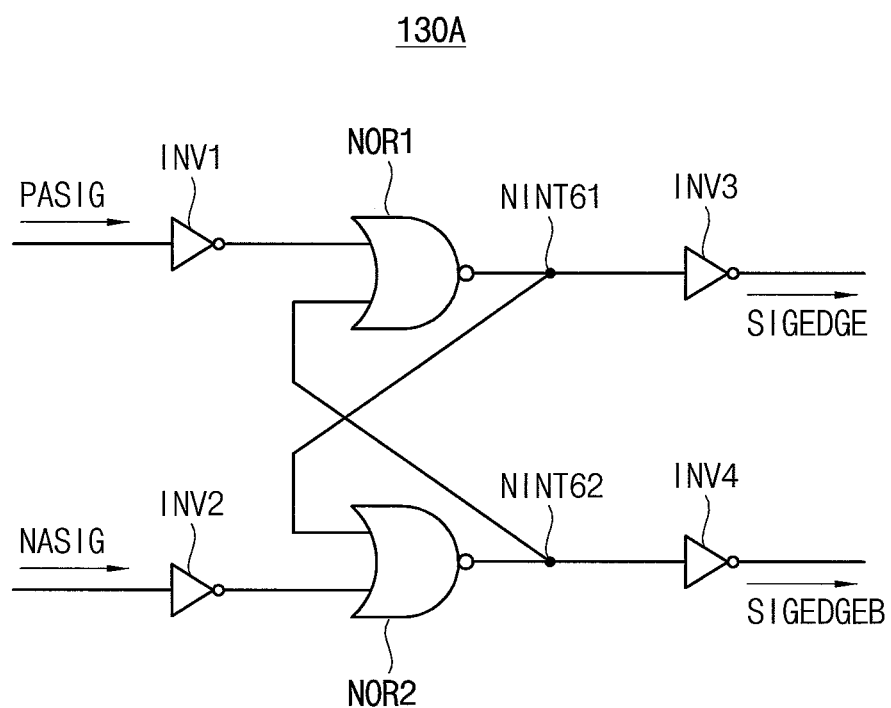
FIG. 9 is a circuit diagram illustrating a latch in the edge detector of FIG. 1 according to an exemplary embodiment of the present inventive concept.

FIG. 9 is a circuit diagram illustrating the latch in the edge detector of FIG. 1 according to an exemplary embodiment of the present inventive concept.

In FIG. 9, a NOR-type S-R latch 130A is illustrated, but exemplary embodiments of the present inventive concept are not limited thereto.

Referring to FIG. 9, the S-R latch 130A includes a first NOR gate NOR1, a second NOR gate NOR2 and first through fourth inverters INV1~INV4.

The first inverter INV1 has an input terminal for receiving the first amplification signal PASIG and an output terminal coupled to a first input terminal of the first NOR gate NOR1. The first NOR gate NOR1 has a second input terminal coupled to a second internal node NINT62 and an output terminal coupled to a first internal node NINT61. The third inverter INV3 has an input terminal coupled to the first internal node NINT61 and an output terminal that provides the edge signal SIGEDGE. The second inverter INV2 has an input terminal for receiving the second amplification signal NASIG and an output terminal coupled to a first input terminal of the second NOR gate NOR2. The second NOR gate NOR2 has a second input terminal coupled to the first internal node NINT61 and an output terminal coupled to the second internal node NINT62. The fourth inverter INV4 has an input terminal coupled to the second internal node NINT62 and an output terminal that provides an inverted version SIGEDGEB of the edge signal SIGEDGE.

Figure 10:
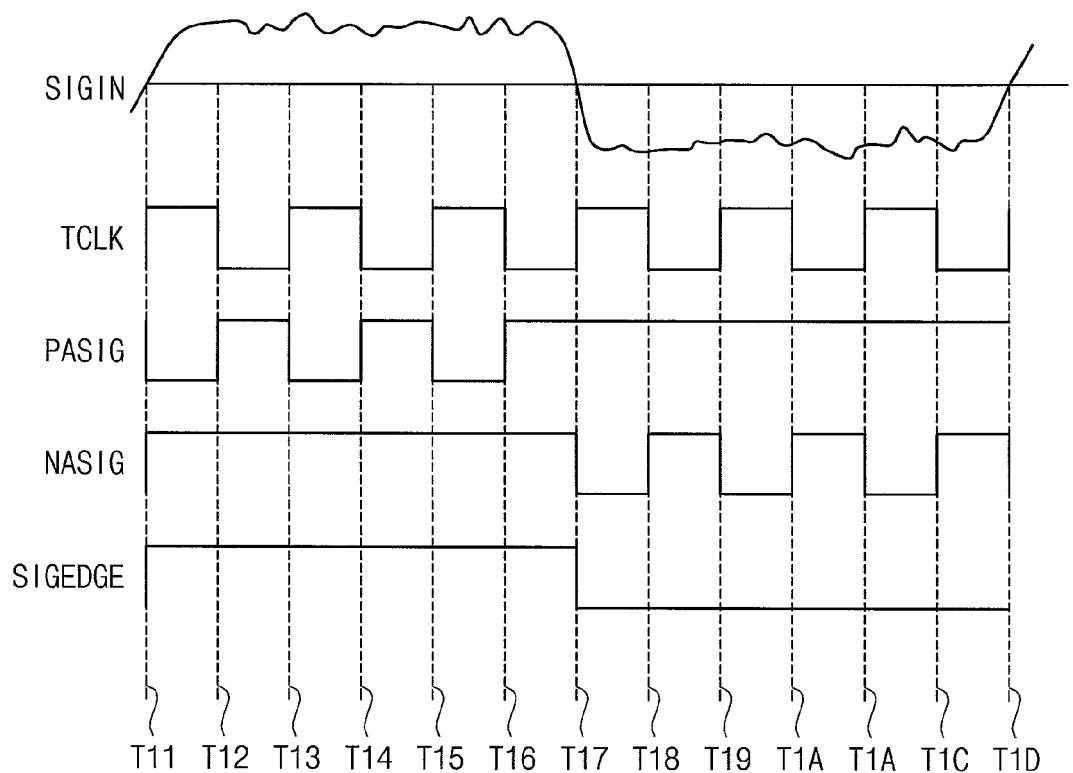
FIG. 10 is a timing diagram illustrating an operation of the edge detector of FIG. 1 according to an exemplary embodiment of the present inventive concept.

FIG. 10 is a timing diagram illustrating an operation of the edge detector of FIG. 1 according to an exemplary embodiment of the present inventive concept.

Referring to FIG. 10, since the first differential signal DFSIG1 is greater than the second differential signal DFSIG2 at a first timing T11 corresponding to a rising edge of the test clock signal TCLK, the sense amplifier 120 sets the first amplification signal PASIG to the ground voltage GND and the second amplification signal NASIG to the power supply voltage VDD. The latch 130 activates the edge signal SIGEDGE.

From the first timing T11 to a second timing T12 corresponding to a falling edge of the test clock signal TCLK, the sense amplifier 120 maintains the first amplification signal PASIG at the ground voltage GND and maintains the second amplification signal NASIG at the power supply voltage VDD. The latch 130 maintains the edge signal SIGEDGE at an active state.

At the second timing T12, the sense amplifier 120 resets the first amplification signal PASIG and the second amplification signal NASIG to the power supply voltage VDD. The latch 130 maintains the edge signal SIGEDGE at an active state.

From the second timing T12 to a third timing T13 corresponding to a rising edge of the test clock signal TCLK, the sense amplifier 120 maintains the first amplification signal PASIG and the second amplification signal NASIG at the reset state. The latch 130 maintains the edge signal SIGEDGE at an active state.

From the third timing T13 to a seventh timing T17, operation of the edge detector 100 repeats above-mentioned operations (e.g., the steps from T11 to T13).

Since the first differential signal DFSIG1 is smaller than the second differential signal DFSIG2 at the seventh timing T17 corresponding to a rising edge of the test clock signal TCLK, the sense amplifier 120 sets the first amplification signal PASIG to the power supply voltage VDD and the second amplification signal NASIG to the ground voltage GND. The latch 130 deactivates the edge signal SIGEDGE.

From the seventh timing T17 to an eighth timing T18 corresponding to a falling edge of the test clock signal TCLK, the sense amplifier 120 maintains the first amplification signal PASIG at the power supply voltage VDD and maintains the second amplification signal NASIG at the ground voltage GND. The latch 130 maintains the edge signal SIGEDGE at an inactive state.

At the eighth timing T18, the sense amplifier 120 resets the first amplification signal PASIG and the second amplification signal NASIG to the power supply voltage VDD. The latch 130 maintains the edge signal SIGEDGE at an inactive state.

From the eighth timing T18 to a ninth timing T19 corresponding to a rising edge of the test clock signal TCLK, the sense amplifier 120 maintains the first amplification signal PASIG and the second amplification signal NASIG at the reset state. The latch 130 maintains the edge signal SIGEDGE at an inactive state.

From the ninth timing T19 to a thirteenth timing T1D, the operation of the edge detector 100 repeats above-mentioned operation (e.g., the steps from T17 to T19).

The edge detector 100 generates the edge signal SIGEDGE including edge information of the input signal SIGIN. In an exemplary embodiment of the present inventive concept, a duty cycle of the edge signal SIGEDGE may correspond to a duty cycle of the input signal SIGIN. In other words, the duty cycle of the edge signal SIGEDGE may be substantially the same as the duty cycle of the input signal SIGIN. In an exemplary embodiment of the present inventive concept, a jitter of the edge signal SIGEDGE at an edge may correspond to a jitter of the input signal SIGIN at an edge. In other words, the jitter of the edge signal SIGEDGE at an edge (T11 or T17) may be substantially the same as the jitter of the input signal SIGIN at an edge (T11 or T17).

Figure 11:
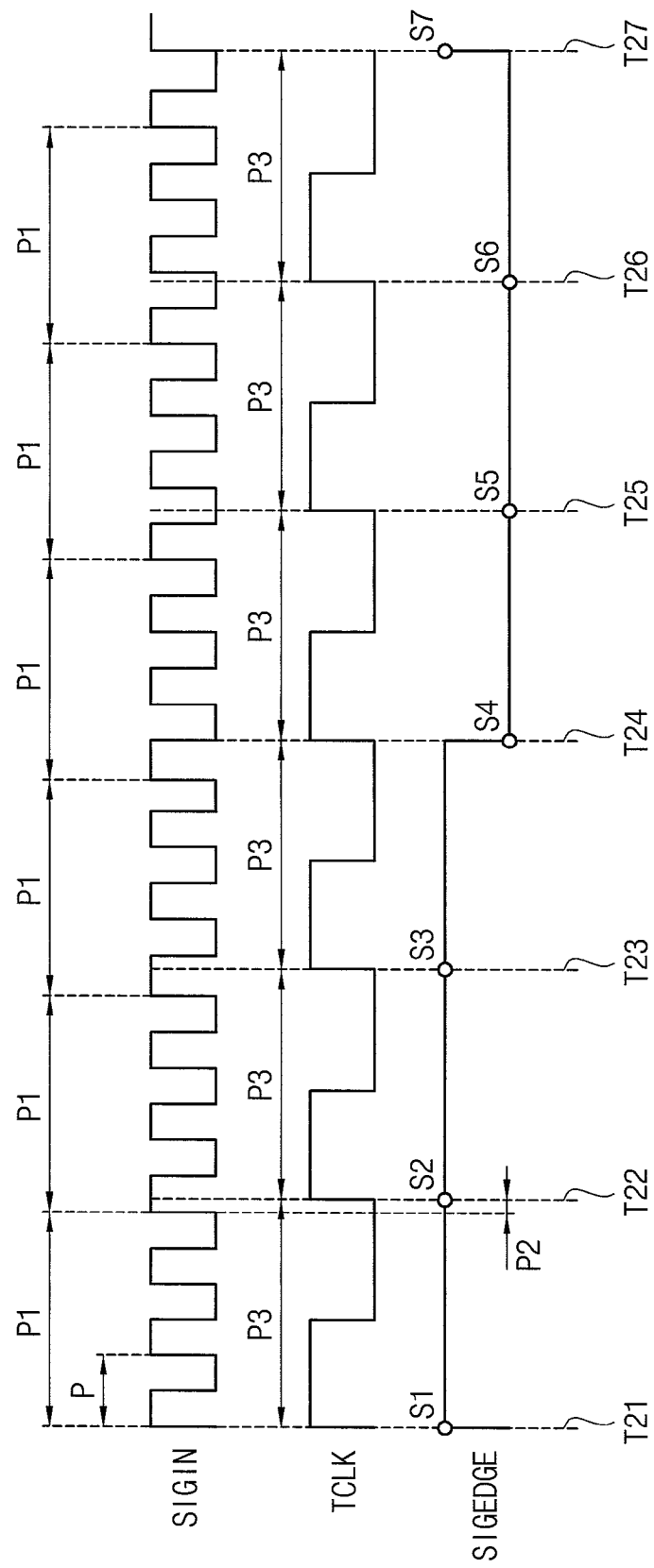
FIG. 11 is a timing diagram illustrating an operation of the edge detector of FIG. 1 according to an exemplary embodiment of the present inventive concept.

FIG. 11 is a timing diagram illustrating an operation of the edge detector of FIG. 1 according to an exemplary embodiment of the present inventive concept.

Referring to FIG. 11, when the input signal SIGIN has a frequency of P, the test clock signal TCLK has a period of P3. P3 corresponds to P1(=N*P)+P2(=M*P), where N is a natural number and M is a rational number greater than zero and smaller than one. In FIG. 11, N is three and M is ⅙.

Since the input signal SIGIN is a periodic signal, the edge detector 100 may generate the edge signal SIGEDGE based on values S1~S7 generated by sampling the input signal SIGIN using the test clock signal at each of timings T21~T27. The period of the test clock signal TCLK is greater than the period of the input signal SIGIN.

The duty cycle of the input signal SIGIN is represented as the duty cycle of the edge signal SIGEDGE. The jitter of the input signal SIGIN at edges T21 and T24 may be represented as the jitter of the edge signal SIGEDGE at edges T21 and T24.

When the edge detector 100 generates the edge signal SIGEDGE using the test clock signal TCLK whose period is greater than the input signal SIGIN, the edge detector 100 consumes less power compared with a case when the edge detector 100 generates the edge signal SIGEDGE using the test clock signal TCLK whose period is smaller than the input signal SIGIN.

Figure 12:
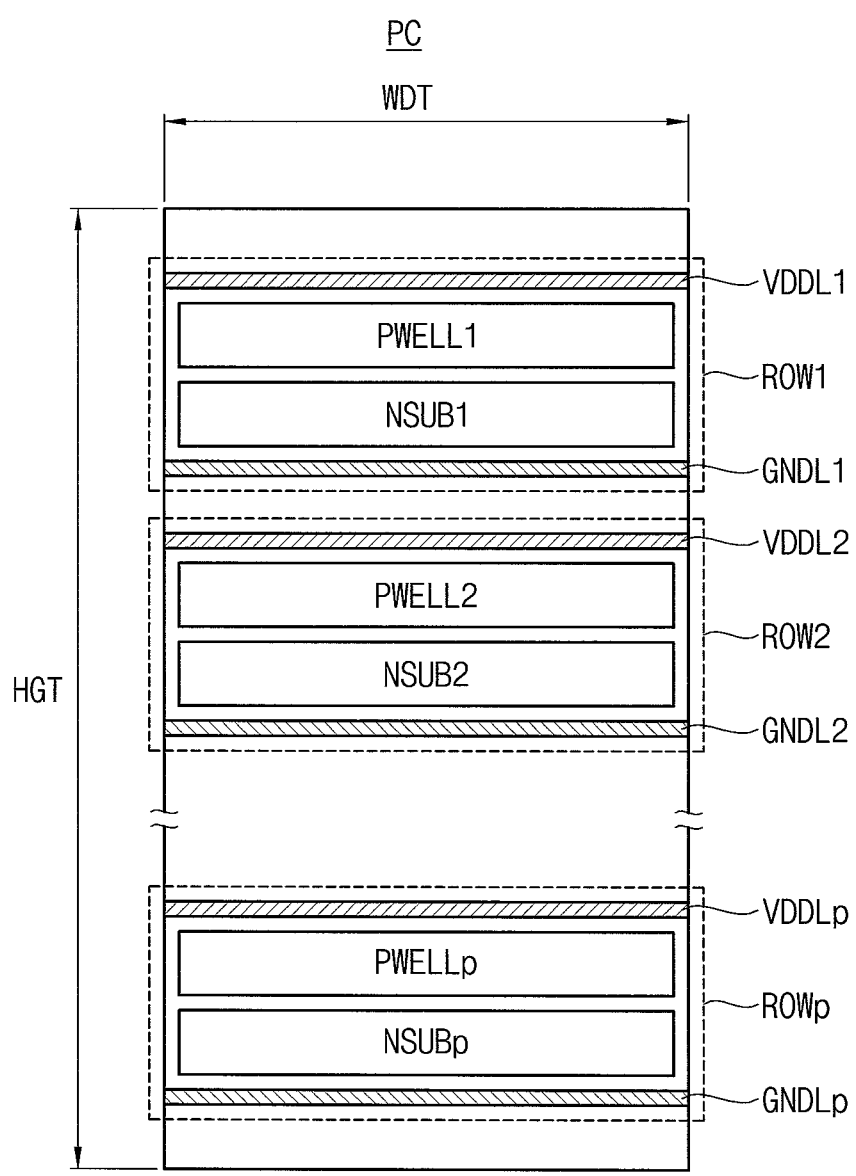
FIG. 12 illustrates the edge detector of FIG. 1 implemented with a primitive cell using a complementary metal-oxide semiconductor (CMOS) process according to an exemplary embodiment of the present inventive concept.

FIG. 12 illustrates the edge detector of FIG. 1 implemented with a primitive cell using a complementary metal-oxide semiconductor (CMOS) process according to an exemplary embodiment of the present inventive concept.

Referring to FIG. 12, the differential signal generator 110, the sense amplifier 120 and the latch 130 are implemented with a primitive cell using a CMOS process. The primitive cell PC refers to a circuit library cell that is physically standardized for reuse of CMOS circuit design. For example, the primitive cell PC may be defined by a height HGT and a width WDT. The primitive cell PC includes first through p-th row circuits ROW1~ROWp, wherein p is a natural number.

The first row circuit ROW1 may include a first P-well region PWELL1 and a first N-sub region NSUB1. A first power supply line VDDL1 that supplies a power supply voltage VDD, a first ground voltage line GNDL1 that supplies a ground voltage GND and PMOS transistors are implemented in the first P-well region PWELL1. NMOS transistors are implemented in the first N-sub region NSUB1. The second row circuit ROW2 may include a second P-well region PWELL2 and a second N-sub region NSUB2. A second power supply line VDDL2 that supplies the power supply voltage VDD, a second ground voltage line GNDL2 that supplies the ground voltage GND and PMOS transistors are implemented in the second P-well region PWELL2. NMOS transistors are implemented in the second N-sub region NSUB2. The p-th row circuit ROWp may include a p-th P-well region PWELLp and a p-th N-sub region NSUBp. A p-th power supply line VDDLp that supplies the power supply voltage VDD, a p-th ground voltage line GNDLp that supplies the ground voltage GND and PMOS transistors are implemented in the p-th P-well region PWELLp. NMOS transistors are implemented in the p-th N-sub region NSUBp.

PMOS transistors in the differential signal generator 110, the sense amplifier 120 and the latch 130 are located in the P-well regions PWELL1~PWELLp in the primitive cell PC and NMOS transistors in the differential signal generator 110, the sense amplifier 120 and the latch 130 are located in the N-sub region NSUB1~NSUBp.

Figure 13:
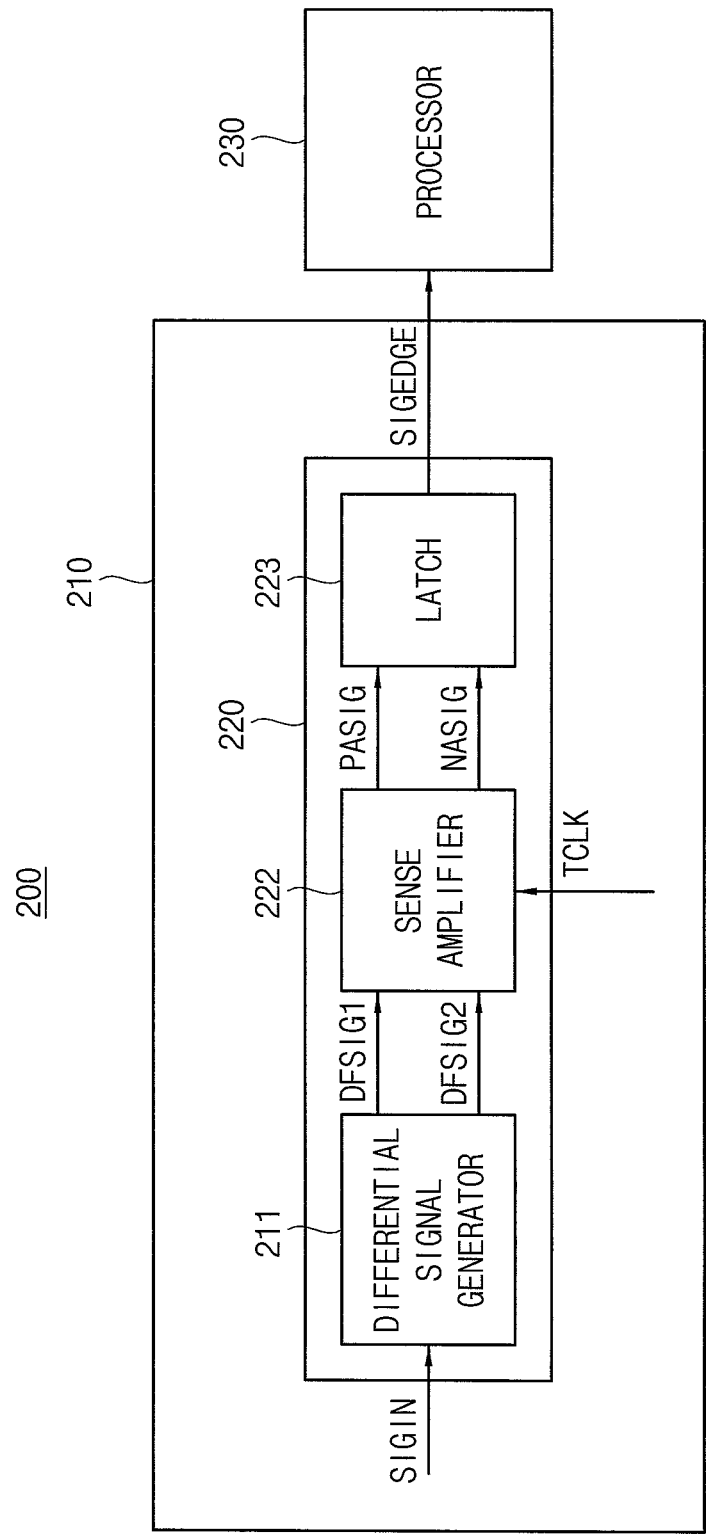
FIG. 13 is a block diagram illustrating a system of analyzing a signal characteristic according to an exemplary embodiment of the present inventive concept.

FIG. 13 is a block diagram illustrating a system of analyzing a signal characteristic according to an exemplary embodiment of the present inventive concept.

Referring to FIG. 13, a system of analyzing a signal characteristic 200 includes an integrated circuit (IC) 210 and a processor 230. The IC 210 includes an edge detector 220.

The edge detector 220 generates an edge signal SIGEDGE including edge information of an internal signal SIGIN based on a test clock signal TCLK. The processor 230 analyzes a characteristic of the internal signal SIGIN based on the edge signal SIGEDGE. The processor 230 may analyze the characteristic of the internal signal SIGEDGE by performing a post processing operation based on a pulse density modulation (PDM) on the edge signal SIGEDGE. The IC 210 and the processor 220 may be located on a semiconductor die or may be individually located on each of plural semiconductor dies.

The edge detector 220 includes a differential signal generator 221, a sense amplifier 222 and a latch 223. The differential signal generator 221 delays the input signal SIGIN to generate a first differential signal DFSIG1 and inverts the input signal SIGIN to generate a second differential signal DFSIG2. The sense amplifier 222 amplifies a difference between the first differential signal DFSIG1 and the second differential signal DFSIG2 to generate a first amplification signal PASIG and a second amplification signal NASIG at a rising edge of a test clock signal TCLK. The sense amplifier 222 resets the first amplification signal PASIG and the second amplification signal NASIG at a falling edge of the test clock signal TCLK. The latch 223 generates an edge signal SIGEDGE corresponding to edge information of the input signal SIGIN based on the first amplification signal PASIG and the second amplification signal NASIG.

In an exemplary embodiment of the present inventive concept, the internal signal SIGIN may be a periodic signal having a first frequency. The test clock signal TCLK has a second period corresponding to sum of a third period and a fourth period. The third period corresponds to N*(the first frequency), the fourth period corresponds to M*(the first frequency), N is a natural number and M is a rational number greater than zero and smaller than one.

The edge detector 220 may employ the edge detector 100 of FIG. 1.

Figure 14:
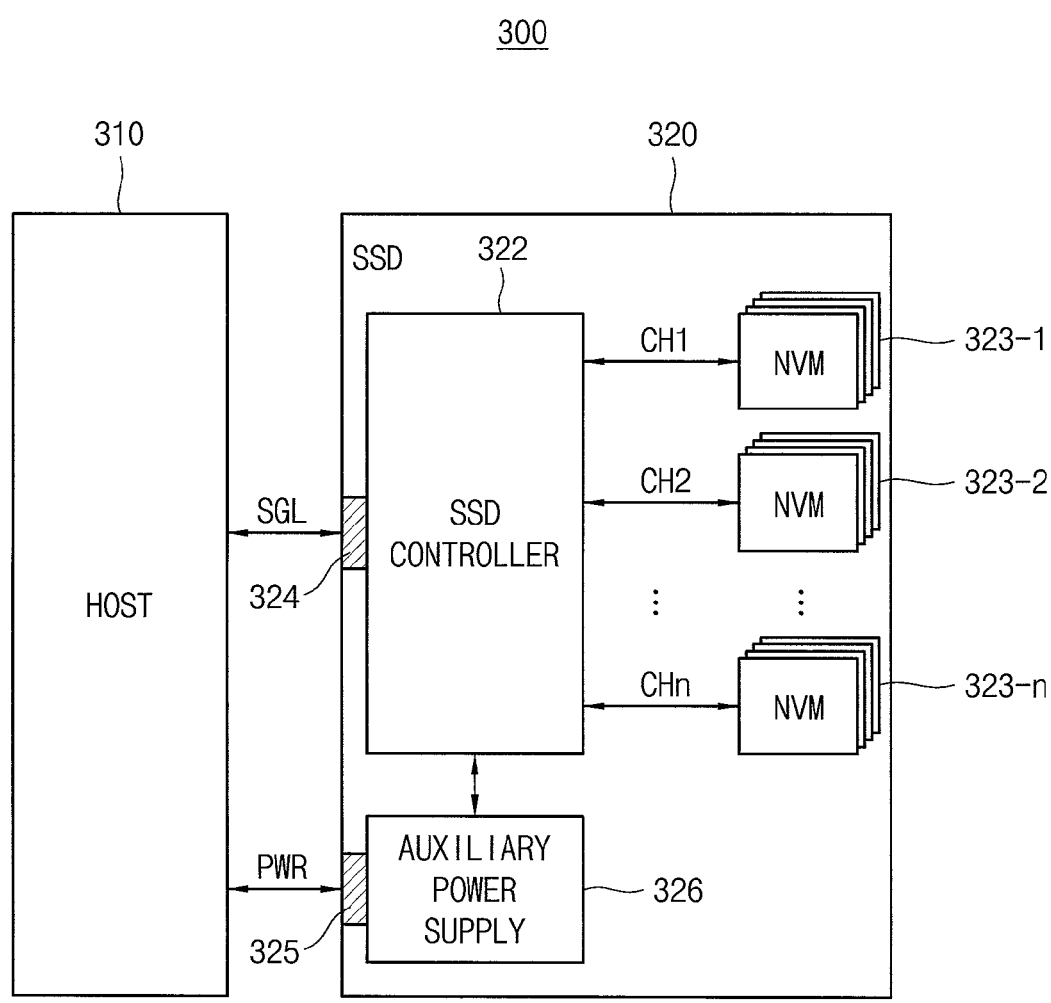
FIG. 14 is a block diagram illustrating a solid state drive (SSD) system according to an exemplary embodiment of the present inventive concept.

FIG. 14 is a block diagram illustrating a solid state drive (SSD) system according to an exemplary embodiment of the present inventive concept.

Referring to FIG. 14, an SSD system 300 includes a host 310 and an SSD 320. The SSD 320 includes first through n-th non-volatile memory devices 323-1, 323-2, . . . , 323-n and a SSD controller 322. Here, n represents an integer greater than or equal to 2. The first through n-th non-volatile memory devices 323-1, 323-2, . . . , 323-n may be used as a storage medium of the SSD 320.

Each of the first through n-th non-volatile memory devices 323-1, 323-2, . . . , 323-n may include a memory cell array formed on a substrate with a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The SSD controller 322 is coupled to the first through n-th non-volatile memory devices 323-1, 323-2, . . . , 323-n through first to n-th channels CH1, CH2, . . . , CHn, respectively.

The SSD controller 322 exchanges a signal SGL with the host 310 through a signal connector 324. The signal SGL may include a command, an address and data. The SSD controller 322 may perform a program operation and a read operation on the first through n-th non-volatile memory devices 323-1, 323-2, . . . , 323-n according to the command received from the host 310.

The SSD 320 may further include an auxiliary power supply 326. The auxiliary power supply 326 may receive a power PWR from the host 310 through a power connector 325 and provide a power to the SSD controller 322. The auxiliary power supply 326 may be placed inside or outside the SSD 320. For example, the auxiliary power supply 326 may be placed in a main board and provide auxiliary power to the SSD 320.

Each component of the SSD system 300 may correspond to the IC 210 in FIG. 13, and may include an internal edge detector corresponding to the edge detector 220 of FIG. 13. The internal edge detector may generate an edge signal corresponding to edge information of an internal signal of each component of the SSD system 300 and the internal signal may be analyzed by an external processor or an external system.

Figure 15:
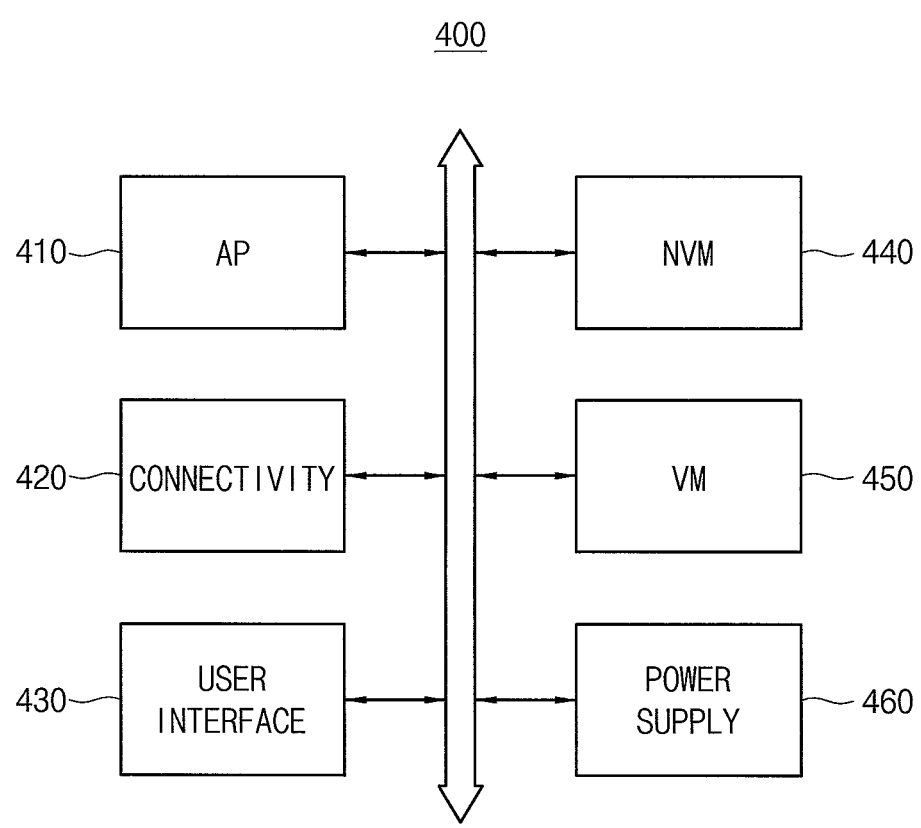
FIG. 15 is a block diagram illustrating a mobile system according to an exemplary embodiment of the present inventive concept.

FIG. 15 is a block diagram illustrating a mobile system according to an exemplary embodiment of the present inventive concept.

Referring to FIG. 15, a mobile system 400 includes an application processor 410, a connectivity unit 420, a user interface 430, a nonvolatile memory device 440, a volatile memory device 450 and a power supply 460.

In an exemplary embodiment of the present inventive concept, the mobile system 400 may be a mobile phone, a smart phone, a personal digital assistant (PDA), a portable multimedia player (PMP), a digital camera, a music player, a portable game console, a navigation system, etc.

The application processor 410 may execute applications, such as a web browser, a game application, a video player, etc. In an exemplary embodiment of the present inventive concept, the application processor 410 may include a single core or multiple cores. For example, the application processor 410 may be a multi-core processor, such as a dual-core processor, a quad-core processor, a hexa-core processor, etc. The application processor 410 may include an internal or external cache memory.

The connectivity unit 420 may perform wired or wireless communication with an external device. For example, the connectivity unit 420 may perform Ethernet communication, near field communication (NFC), radio frequency identification (RFID) communication, mobile telecommunication, memory card communication, universal serial bus (USB) communication, etc. In an exemplary embodiment of the present inventive concept, the connectivity unit 420 may include a baseband chipset that supports communications, such as global system for mobile communications (GSM), general packet radio service (GPRS), wideband code division multiple access (WCDMA), high speed downlink/uplink packet access (HSxPA), etc.

The nonvolatile memory device 440 may store a boot image for booting the mobile system 400.

The nonvolatile memory device 440 may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The volatile memory device 450 may store data processed by the application processor 410, or may operate as a working memory.

The user interface 430 may include at least one input device, such as a keypad, a touch screen, etc., and at least one output device, such as a speaker, a display device, etc.

The power supply 460 may supply an operating voltage to the mobile system 400. The power supply 460 includes a regulator circuit. The regulator circuit may be employed by the edge detector 100 of FIG. 1. The regulator circuit may be employed by the IC 210 in FIG. 11 and the application processor 410, the connectivity unit 420, the user interface 430, the non-volatile memory device 440 and the volatile memory device 450 may correspond to the edge detector 220 in FIG. 11.

In an exemplary embodiment of the present inventive concept, the mobile system 400 may further include an image processor, and/or a storage device, such as a memory card, an SSD, a hard disk drive (HDD), a compact disk read only memory (CD-ROM), etc.

In an exemplary embodiment of the present inventive concept, the mobile system 400 and/or components of the mobile system 400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

Each component of the mobile system 400 may correspond to the IC 210 in FIG. 13, and may include an internal edge detector corresponding to the edge detector 220 of FIG. 13. The internal edge detector may generate an edge signal corresponding to edge information of an internal signal of each component of the mobile system 400 and the internal signal may be analyzed by an external processor or an external system.

Figure 16:
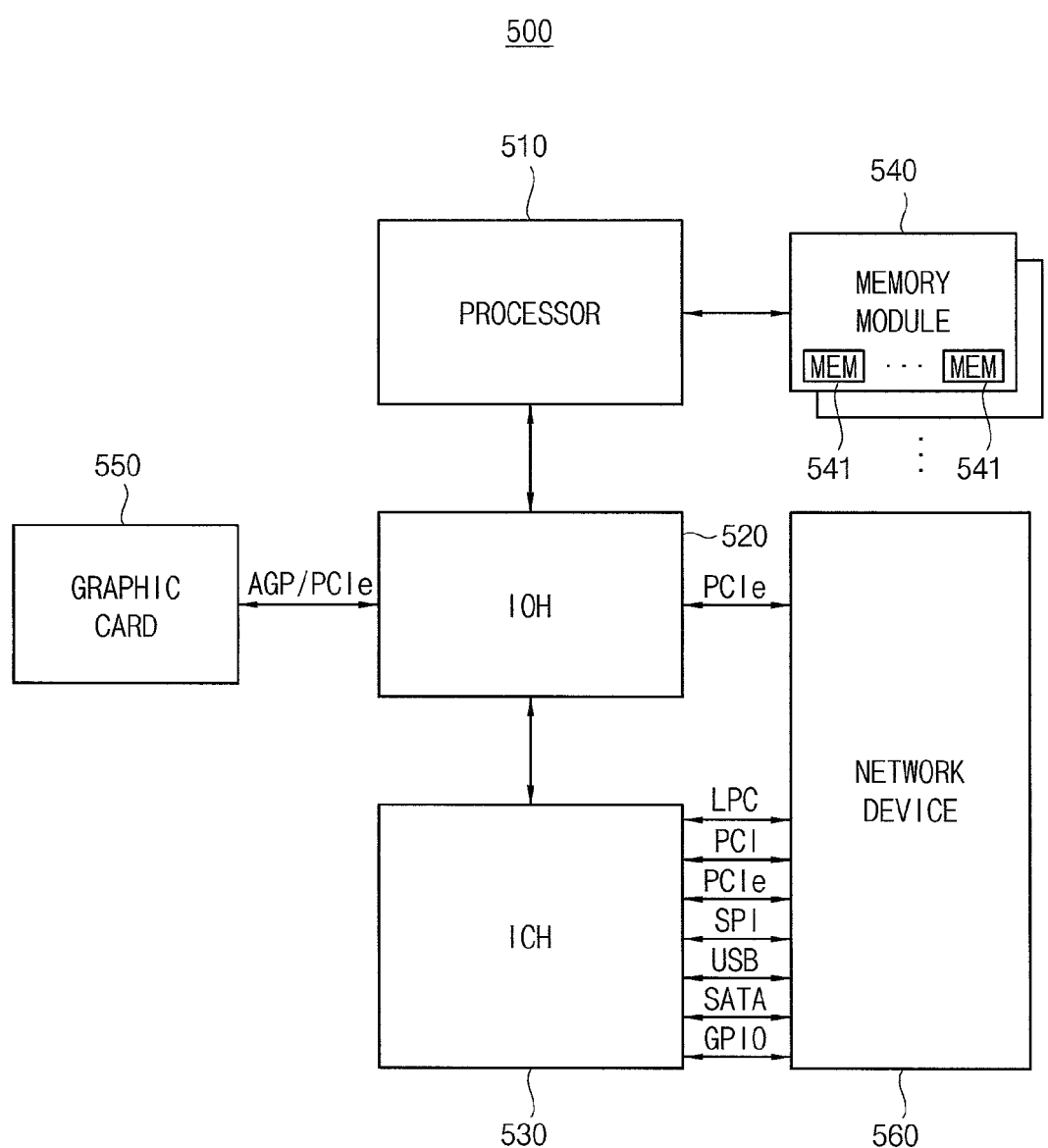
FIG. 16 is a block diagram illustrating a computing system according to an exemplary embodiment of the present inventive concept.

FIG. 16 is a block diagram illustrating a computing system according to an exemplary embodiment of the present inventive concept.

Referring to FIG. 16, a computing system 500 includes a processor 510, an input/output hub (IOH) 520, an input/output controller hub (ICH) 530, at least one memory module 540, a network device 560 and a graphics card 550. In an exemplary embodiment of the present inventive concept, the computing system 500 may be a personal computer (PC), a server computer, a workstation, a laptop computer, a mobile phone, a smart phone, a PDA, a PMP, a digital camera), a digital television, a set-top box, a music player, a portable game console, a navigation system, etc.

The processor 510 may perform various computing functions, such as executing specific software for performing specific calculations or tasks. For example, the processor 310 may be a microprocessor, a central processing unit (CPU), a digital signal processor, or the like. In an exemplary embodiment of the present inventive concept, the processor 510 may include a single core or multiple cores. For example, the processor 510 may be a multi-core processor, such as a dual-core processor, a quad-core processor, a hexa-core processor, etc. Although FIG. 16 illustrates the computing system 500 including one processor 510, in an exemplary embodiment of the present inventive concept, the computing system 300 may include a plurality of processors.

The processor 510 may include a memory controller for controlling operations of the memory module 540. The memory controller included in the processor 510 may be referred to as an integrated memory controller (IMC). A memory interface between the memory controller and the memory module 540 may be implemented with a single channel including a plurality of signal lines, or may be implemented with multiple channels. At least one memory module 540 may be coupled to an individual channel. In an exemplary embodiment of the present inventive concept, the memory controller may be located inside the input/output hub 520. The input/output hub 520 including the memory controller may be referred to as memory controller hub (MCH).

The memory module 540 may include a plurality of memory devices MEM 541 that store data provided from the memory controller of the processor 510.

The input/output hub 520 may manage data transfer between the processor 510 and devices, such as the graphics card 550. The input/output hub 520 may be coupled to the processor 510 via various interfaces. For example, the interface between the processor 510 and the input/output hub 520 may be a front side bus (FSB), a system bus, a HyperTransport, a lightning data transport (LDT), a Quick-Path interconnect (QPI), a common system interface (CSI), etc. The input/output hub 520 may provide various interfaces with the devices. For example, the input/output hub 520 may provide an accelerated graphics port (AGP) interface, a peripheral component interconnect-express (PCIe), a communications streaming architecture (CSA) interface, etc. For example, the input/output hub 520 may be coupled to the network device 560 via PCIe. Although FIG. 16 illustrates the computing system 500 including one input/output hub 520, in an exemplary embodiment of the present inventive concept, the computing system 500 may include a plurality of input/output hubs.

The graphics card 550 may be coupled to the input/output hub 520 via AGP or PCIe. The graphics card 550 may control a display device for displaying an image. The graphics card 550 may include an internal processor for processing image data and an internal memory device. In an exemplary embodiment of the present inventive concept, the input/output hub 520 may include an internal graphics device along with or instead of the graphics card 550 outside the graphics card 550. The graphics device included in the input/output hub 520 may be referred to as integrated graphics. Further, the input/output hub 520 including the internal memory controller and the internal graphics device may be referred to as a graphics and memory controller hub (GMCH).

The input/output controller hub 530 may perform data buffering and interface arbitration to efficiently operate various system interfaces. The input/output controller hub 530 may be coupled to the input/output hub 520 via an internal bus, such as a direct media interface (DMI), a hub interface, an enterprise Southbridge interface (ESI), PCIe, etc.

The input/output controller hub 530 may provide various interfaces with peripheral devices. For example, the input/output controller hub 530 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The network device 560 may receive data of the processor 510 and the graphics card 550 through the PCIe of the input/output hub 520 or one of the USB port, the SATA port, the GPIO, the LPC bus, the SPI, the PCI, and the PCIe of the input/output controller hub 530. The network device 560 may transmit the data to another computing system. The network device 560 may receive other data from the other computing system.

Each component of the computing system 500 may correspond to the IC 210 in FIG. 13, and may include an internal edge detector corresponding to the edge detector 220 of FIG. 13. The internal edge detector may generate an edge signal corresponding to edge information of an internal signal of each component of the computing system 500 and the internal signal may be analyzed by an external processor or an external system.

In an exemplary embodiment of the present inventive concept, the processor 510, the input/output hub 520 and the input/output controller hub 530 may be implemented as separate chipsets or separate integrated circuits. In an exemplary embodiment of the present inventive concept, at least two of the processor 510, the input/output hub 520 and the input/output controller hub 530 may be implemented as a single chipset.

Exemplary embodiments of the present inventive concept may be applied to test systems for testing semiconductor circuits.

According to an exemplary embodiment of the present inventive concept, since the edge detector generates an edge signal corresponding to edge information of internal signals based on a test clock signal whose frequency is lower (e.g., much lower) than a frequency of the internal signals in a semiconductor die, power consumption of the edge detector may be reduced. In addition, since the edge detector does not require a reference voltage, circuit complexity of the edge detector may be reduced. In addition, since the processor performs post-processing on an edge signal of the edge detector, a performance of the system including the edge detector may be increased.

While the present inventive concept has been particularly shown and described with reference to exemplary embodiments thereof, it will be apparent to those of ordinary skill in the art that various changes in form and detail may be made therein without departing from the spirit and scope of the present inventive concept as defined by the following claims.

What is claimed is:

1. An edge detector, comprising:
a differential signal generator configured to delay an input signal to generate a first differential signal and configured to invert the input signal to generate a second differential signal;
a sense amplifier configured to amplify a difference between the first differential signal and the second differential signal to generate a first amplification signal and a second amplification signal at a first edge of a test clock signal and configured to reset the first amplification signal and the second amplification signal at a second edge of the test clock signal; and
a latch configured to generate an edge signal corresponding to edge information of the input signal in response to the first amplification signal and the second amplification signal.

2. The edge detector of claim 1, wherein the input signal is a periodic signal having a first period (P), and wherein the test dock signal has a second period corresponding to a sum of a third period and a fourth period, and
wherein the third period corresponds to N*P, the fourth period corresponds to M*P, N is a natural number and M is a rational number greater than zero and smaller than one.

3. The edge detector of claim 1, wherein a duty cycle of the edge signal is substantially the same as a duty cycle of the input signal, and a jitter of the edge signal at an edge is substantially the same as a jitter of the input signal at a corresponding edge,
the differential signal generator is configured to delay the input signal by a first time to generate the first differential signal, and to invert the input signal for a second time to generate the second differential signal, and
the first time is substantially the same as the second time.

4. The edge detector of claim 1, wherein the differential signal generator comprises:
a delay circuit configured to generate the first differential signal by delaying the input signal; and
an inverting circuit configured to generate the second differential signal by inverting the input signal.

5. The edge detector of claim 4, wherein the delay circuit comprises a PMOS transistor and an NMOS transistor and the input signal is input to a first internal node of the delay circuit,
wherein the PMOS transistor has a source coupled to the first internal node, a gate for receiving a first offset voltage and a drain coupled to a second internal node of the delay circuit,
wherein the first differential signal is output at the second internal node,
wherein the NMOS transistor has a drain coupled to the first internal node, a gate for receiving a second offset voltage and a source coupled to the second internal node, and
wherein the delay circuit is configured to adjust a first propagation delay of the delay circuit in response to the first offset voltage and the second offset voltage such that the first propagation delay is substantially the same as a second propagation delay of the inverting circuit.

6. The edge detector of claim 4, wherein the delay circuit comprises a first inverter and a second inverter,
the first inverter has an input terminal for receiving the input signal and an output terminal coupled to an input terminal of the second inverter,
the second inverter has an output terminal at which the first differential signal is output, and,
a sum of a first propagation delay of the first inverter and a second propagation delay of the second inverter is substantially the same as a propagation delay of the inverting circuit.

7. The edge detector of claim 6, wherein the delay circuit is configured to adjust the first propagation delay in response to a first offset voltage and a second offset voltage.

8. The edge detector of claim 4, wherein the delay circuit includes a first exclusive OR gate and
the first exclusive OR gate has a first input terminal for receiving a ground voltage, a second input terminal for receiving the input signal and an output terminal that outputs the first differential signal,
wherein the inverting circuit includes a second exclusive OR gate, and
the second exclusive OR gate has a first input terminal for receiving a power supply voltage, a second input terminal for receiving the input signal and an output terminal that outputs the second differential signal, and
wherein a propagation delay of the first exclusive OR gate is substantially the same as a propagation delay of the second exclusive OR gate.

9. The edge detector of claim 1, wherein the sense amplifier comprises first through fourth PMOS transistors and first through sixth NMOS transistors,
the first PMOS transistor has a source coupled to a power supply voltage, a gate for receiving the test clock signal and a drain coupled to a first internal node of the sense amplifier that outputs the first amplification signal,
the second PMOS transistor has a source coupled to the power supply voltage, a gate coupled to a second internal node of the sense amplifier and a drain coupled to the first internal node, the third PMOS transistor has a source coupled to the power supply voltage, a gate coupled to the first internal node and a drain coupled to the second internal node that outputs the second amplification signal, the fourth PMOS transistor has a source coupled to the power supply voltage, a gate for receiving the test clock signal and a drain coupled to the second internal node, the first NMOS transistor has a drain coupled to the first internal node, a gate coupled to the second internal node and a source coupled to a third internal node of the sense amplifier, the second NMOS transistor has a drain coupled to the second internal node, a gate coupled to the first internal node and a source coupled to a fourth internal node of the sense amplifier, the third NMOS transistor has a drain coupled to the third internal node, a gate for receiving the test clock signal and a source coupled to a fifth internal node of the sense amplifier, the fourth NMOS transistor has a drain coupled to the fourth internal node, a gate for receiving the test clock signal and a source coupled to a sixth internal node of the sense amplifier, the fifth NMOS transistor has a drain coupled to the fifth internal node, a gate for receiving the first differential signal and a source coupled to a ground voltage, and the sixth NMOS transistor has a drain coupled to the sixth internal node, a gate for receiving the second differential signal and a source coupled to the ground voltage.

10. The edge detector of claim 1, wherein the sense amplifier resets the first amplification signal and the second amplification signal to a power supply voltage at the second edge of the test clock signal.

11. The edge detector of claim 1, wherein the latch includes an S-R latch.

12. The edge detector of claim 1, wherein a PMOS transistor in the differential signal generator, the sense amplifier or the latch is located in a P-well region in a primitive cell, and an NMOS transistor in the differential signal generator, the sense amplifier or the latch is located in an N sub-region in the primitive cell.

13. The edge detector of claim 1, wherein the first edge of the test clock signal is a rising edge and the second edge of the test clock signal is a falling edge.

14. A system of analyzing a signal characteristic, the system comprising:
an integrated circuit including an edge detector configured to generate a second signal corresponding to edge information of a first signal in response to a clock signal; and a processor configured to analyze a characteristic of the first signal in response to the second signal, wherein the edge detector comprises:

a differential signal generator configured to delay the first signal to generate a first differential signal and configured to invert the first signal to generate a second differential signal;

a sense amplifier configured to amplify a difference between the first differential signal and the second differential signal to generate a first amplification signal and a second amplification signal at a first edge of the clock signal and configured to reset the first amplification signal and the second amplification signal at a second edge of the clock signal; and a latch configured to generate the second signal in response to the first amplification signal and the second amplification signal.

15. The system of claim 14, wherein the processor is configured to analyze the characteristic of the first signal by performing a processing operation which uses a pulse density modulation on the second signal.

16. The system of claim 14, wherein the first signal is a periodic signal having a first period (P), and wherein the clock signal has a second period corresponding to a sum of a third period and a fourth period, and wherein the third period corresponds to N*P, the fourth period corresponds to M*P, N is a natural number and M is a rational number greater than zero and smaller than one.

17. An edge detector, comprising:
a signal generator configured to generate a first signal by delaying an input signal and configured to generate a second signal by inverting the input signal;

a sense amplifier configured to generate third and fourth signals based on a difference between the first and second signals in response to a first edge of a clock signal and configured to place both of the third and fourth signals at a power supply voltage level in response to a second edge of the clock signal; and a storage circuit configured to generate an output signal in response to the third and fourth signals, wherein the output signal includes edge information of the input signal.

18. The edge detector of claim 17, wherein the third signal has a ground voltage level before it has the power supply voltage level.

19. The edge detector of claim 17, wherein the fourth signal maintains the power supply voltage level for a plurality of consecutive periods.

20. The edge detector of claim 17, wherein a frequency of the clock signal is less than a frequency of the input and output signals.

* * * * *